United States Patent [19]

Tsuji et al.

[11] Patent Number: 4,893,124

[45] Date of Patent: Jan. 9, 1990

[54] PIPELINED SERIAL-PARALLEL A/D CONVERTER

[75] Inventors: Kazuhiro Tsuji; Tetsuya Iida; Naoki Sugawa, all of Yokohama, Japan

[73] Assignee: Kabushiki Kaisha Toshiba, Kawasaki, Japan

[21] Appl. No.: 163,025

[22] Filed: Mar. 2, 1988

[30] Foreign Application Priority Data

Mar. 4, 1987 [JP] Japan ................................ 62-47733

[51] Int. Cl.[4] ........................................... H03M 1/14
[52] U.S. Cl. .................................... 341/156; 341/172
[58] Field of Search ............... 341/156, 159, 160, 161, 341/172

[56] References Cited

U.S. PATENT DOCUMENTS 4,008,468  2/1977  Imhoff et al. ...................... 341/156
4,326,192  4/1982  Merrill et al. ...................... 341/172
4,392,124  7/1983  Benoit-Gonin et al. ............. 341/172
4,745,393  5/1988  Tsukada et al. .................... 341/156

OTHER PUBLICATIONS

Dingwall et al., "An 8-MHz CMOS Subranging 8-Bit A/D Converter," IEEE Journal of Solid-State Circuits, vol. SC-20, No. 6, pp. 1138-1143, Dec. 1985.

Primary Examiner—William M. Shoop, Jr.
Assistant Examiner—Marc S. Hoff
Attorney, Agent, or Firm—Finnegan, Henderson, Farabow, Garrett and Dunner

[57] ABSTRACT

An A/D converter of this invention includes a first A/D converter for A/D-converting the input signal and determining upper bits of the n-bit binary code, first and second sample-hold circuits, which are alternately switched each time the first A/D converter samples the analog input signal, for sampling and holding the analog input signal, in synchronism with a sampling timing of the first A/D converter, and a second A/D converter. The second A/D converter is constituted by a reference voltage generator for generating reference voltages, based on contents of the binary code obtained by the first A/D converter, a voltage comparator for comparing the reference voltage with a voltage value of the analog input signal held in one of the first and second sample-hold circuits, which sample and hold the analog input signal corresponding to the binary code, and an encoder for encoding a comparison result output from the voltage comparator and determining lower bits of the n bits.

20 Claims, 10 Drawing Sheets

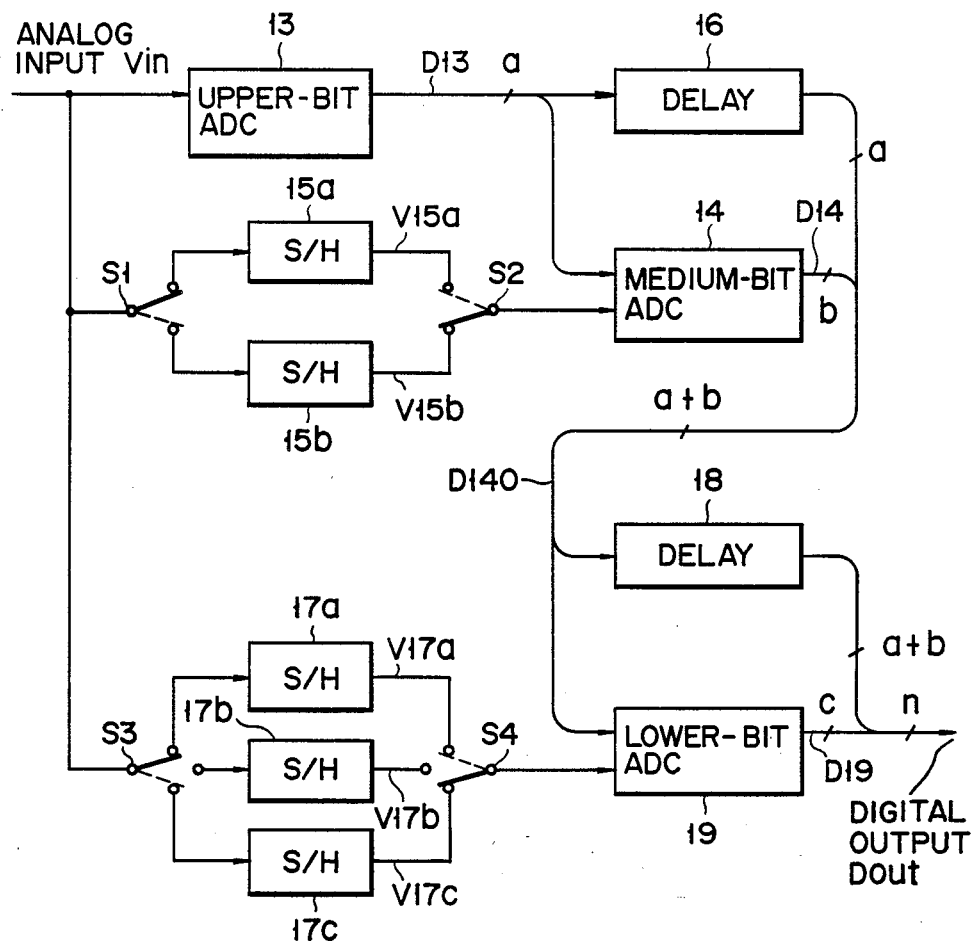
F I G. 8

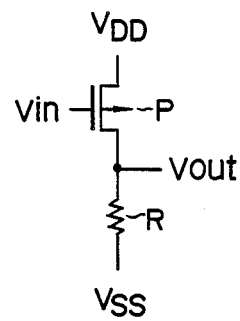
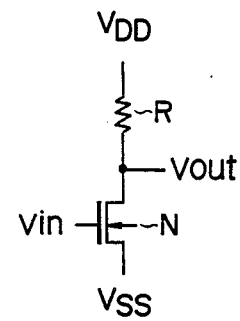
F I G. 16    F I G. 17
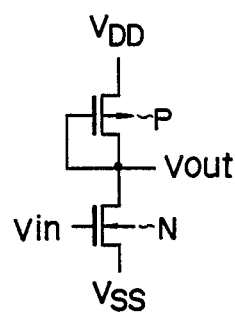
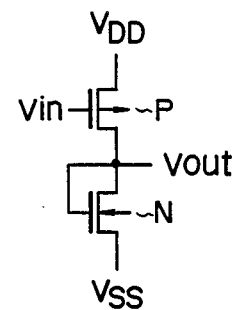
F I G. 18    F I G. 19
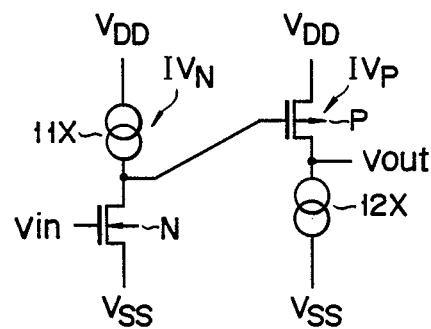
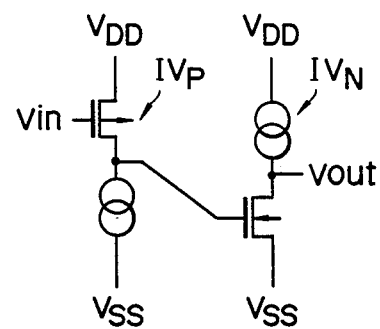
F I G. 20    F I G. 21

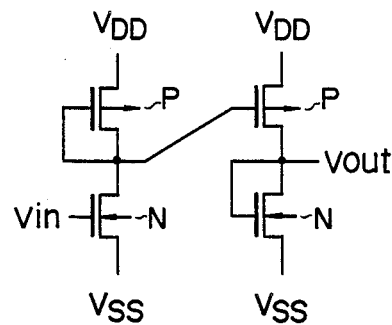
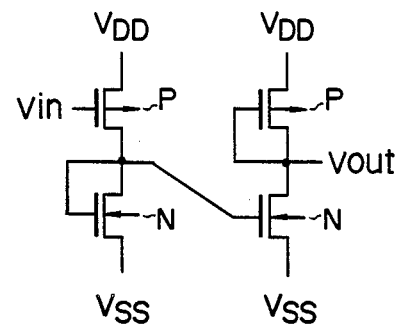
F I G. 22     F I G. 23
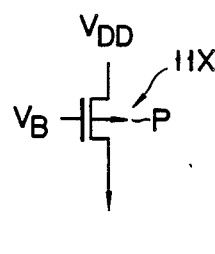
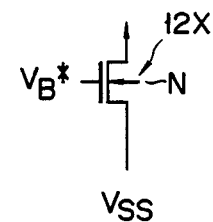
F I G. 24     F I G. 25
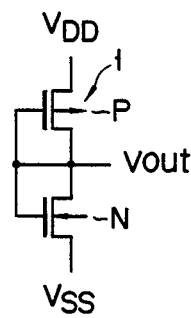
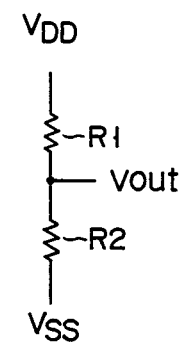
F I G. 26A    F I G. 26B

PIPELINED SERIAL-PARALLEL A/D CONVERTER

BACKGROUND OF THE INVENTION

1. Field of the Invention

The present invention relates to an analog-to-digital converter and, more particularly, to an analog-to-digital converter used in equipment, such as a video signal processor, which requires a high-speed conversion operation.

2. Description of the Related Art

A so-called flush or parallel A/D converter described in literature 1 ("Monolithic Expandable 6 bit 20 MHz CMOS/SOS A/D Converter", ANDREW G. F. DINGWALL, MEMBER, IEEE, IEEE JOURNAL OF SOLID-STATE CIRCUITS, VOL. SC-14, NO. 6, DECEMBER 1979), and a so-called subranging or serial-parallel A/D converter described in literature 2 ("An 8-MHz CMOS Subranging 8-bit A/D Converter", ANDREW G. F. DINGWALL, MEMBER, IEEE, AND VICTOR ZAZZU, MEMBER, IEEE, IEEE JOURNAL OF SOLID-STATE CIRCUITS, VOL. SC-20, NO. 6, DECEMBER 1985) are known typical high-speed A/D (analog-to-digital) converters.

FIG. 4 shows the principle of a parallel A/D converter. An A/D converter converts an analog input signal into an n-bit binary code, and comprises $2^n-1$ parallel voltage comparators $10(1)$ to $10(2^n-1)$. One input of each comparator commonly receives an analog input signal, and the other input thereof receives reference voltage signals, having different voltage values, generated by reference voltage generator 11. Each voltage comparator 10 compares the voltage value of the analog input signal with the given reference voltage, and supplies the comparison result to encoder 12. Encoder 12 outputs a digital signal corresponding to the comparison results, i.e., an n-bit binary code.

The parallel A/D converter described above can perform very high-speed A/D conversion. However, as can be seen from the above description, a large number of voltage comparators 10, corresponding to the number of quantization steps performed, i.e., $2^n-1$, is required for converting an analog signal into an n-bit digital signal. Consequently, this arrangement is quite complex, and an IC chip area required to form the converter is increased in the case of IC formation.

FIG. 5 shows a serial-parallel A/D converter. This converter divides an n-bit binary code into upper a bits and lower b bits, so that A/D conversion relating to the upper a bits is performed by upper-bit A/D conversion section (ADC) 13, after which that relating to the lower b bits is performed by lower-bit A/D conversion section (ADC) 14, on the basis of the conversion result of the upper a bits.

As is shown in FIG. 5, upper-bit A/D conversion section 13 comprises reference voltage generator 11a, voltage comparators 10a, and encoder 12a, in the same manner as the parallel A/D converter shown in FIG. 4. In this case, since A/D conversion corresponding to a bits is performed, the number of voltage comparators 10a provided is $2^a-1$. For the same reason as described above, the number of voltage comparators (10b) provided in A/D conversion section 14 is $2^b-1$. Thus, the total number of voltage comparators is $2^a-1+2^b-1$, and the arrangement can be simpler than that of the parallel A/D converter shown in FIG. 4, which requires $2^n-1$ voltage comparators ($2^n-1>(2^a-1+2^b-1)$).

However, the voltage value of each reference voltage, generated by voltage generator 11b, provided in A/D conversion section 14, is determined by the upper a bit binary code, as the conversion result of A/D conversion section 13. Thus, the conversion operation of A/D conversion section 14 is performed after the conversion in A/D conversion section 13 has been completed. For this reason, A/D conversion sections 13 and 14 cannot execute their conversion operations simultaneously, with the result that the time required to achieve the conversion is doubled as compared to that of the parallel A/D converter shown in FIG. 4.

SUMMARY OF THE INVENTION

The present invention has been conceived in consideration of the above situation and has as its object to provide an A/D converter which can eliminate the conflicting drawbacks of the conventional A/D converters, i.e., the increase in the number of voltage comparators and a complicated circuit arrangement for the purpose of high-speed conversion, and a decrease in conversion rate (conversion speed) when the number of voltage comparators is decreased, and which can perform high-speed A/D conversion by means of a simple circuit arrangement.

The A/D converter of the present invention comprises: a first A/D conversion circuit for converting an analog input signal and determining the upper bits of an n-bit binary code; first and second sample-hold circuits which are alternatively switched each time the first A/D conversion circuit samples the analog input signal, and which sample and hold the analog input signal, in synchronism with the sampling timing of the first A/D conversion circuit; and a second A/D conversion circuit. The second A/D conversion circuit includes a reference voltage generator for generating a reference voltage of a predetermined value, based on the content of the binary code obtained by the first A/D conversion circuit, a voltage comparator for comparing the reference voltage value with the voltage value of the analog input signal held in either the first or second sample-hold circuit, which sample and hold the analog input signal corresponding to the binary code, and an encoder for encoding the comparison result, output from the voltage comparator, into a binary code and determining the lower bits of the n bits.

When one of the first and second sample-hold circuits of the A/D converter having the above arrangement samples and holds an analog input signal, the other sample-hold circuit supplies, to the second A/D conversion circuit, a value which was sampled and held one sampling period before. Therefore, while the first A/D conversion circuit is executing an A/D conversion, the second A/D conversion circuit can perform A/D conversion one sampling period before the A/D conversion currently executed by the first A/D conversion circuit. In this manner, the first and second A/D conversion circuits are operated in a pipeline manner (i.e., operated parallel along the time base), thus making possible high-speed A/D conversion.

BRIEF DESCRIPTION OF THE DRAWINGS

FIG. 8 is a block diagram showing a schematic arrangement of an A/D converter according to yet another embodiment of the present invention;

FIGS. 13 to 17 are diagrams showing a variety of detailed arrangements of an inverting amplifier as shown in FIG. 11;

FIGS. 18 to 23 are diagrams showing a variety of detailed arrangements of a buffer amplifier as shown in FIG. 11;

FIGS. 24 and 25 are diagrams showing detailed arrangements of a constant current source as shown in FIGS. 14 and 15;

FIGS. 26 and 27 are diagrams showing detailed arrangements of a switch circuit as shown in FIG. 11;

DETAILED DESCRIPTION OF THE PREFERRED EMBODIMENT

An embodiment of the present invention will now be described, with reference to the accompanying drawings.

Figure 1:
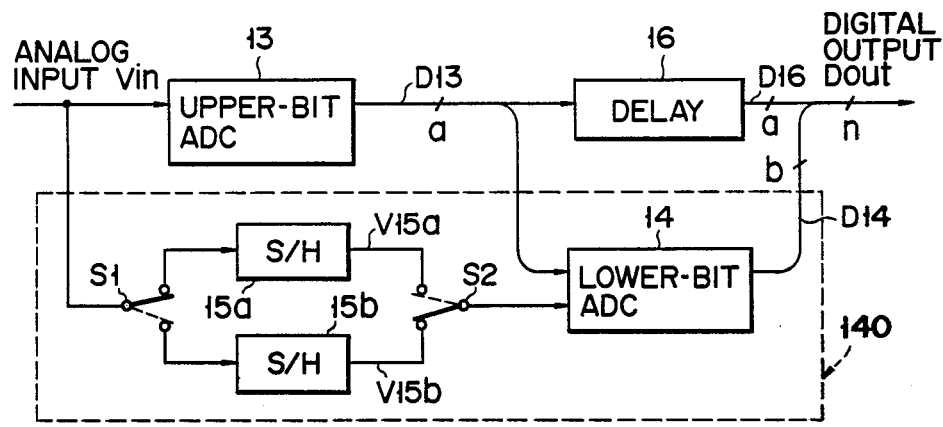
FIG. 1 is a block diagram showing a schematic arrangement of an A/D converter according to an embodiment of the present invention.
Figure 5:
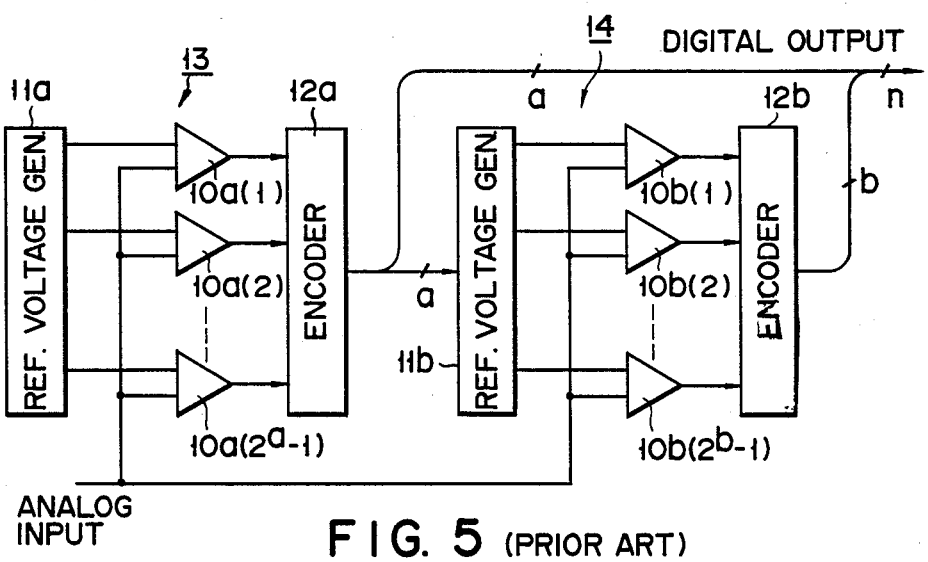
FIG. 5 is a diagram showing a conventional serial-parallel A/D converter.

FIG. 1 shows an A/D converter according to an embodiment of the present invention. In this A/D converter, A/D conversion relating to upper a bits is performed by upper-bit A/D conversion section (ADC) 13, and that relating to lower b bits is performed by lower-bit A/D conversion section (ADC) 14. This feature is the same as that of the conventional A/D converter as shown in FIG. 5. However, in this embodiment, pipelining of ADCs 13 and 14 is performed using two sample-hold (S/H) circuits 15a and 15b which are connected to the input terminal of ADC 14.

The operations of S/H circuits 15a and 15b are switched by two switches, S1 and S2, between a sample-hold operation for analog input signal Vin and an output operation for the sampled and held value. More specifically, when one S/H circuit, for example, 15a, samples and holds analog input signal Vin, the other S/H circuit, 15b, supplies ADC 14 with a value (V15b) which was sampled and held one sampling period before.

Since switches S1 and S2 are switched every sample operation, when ADC 13 corresponding to the upper a bits samples analog input signal Vin, one of S/H circuits 15a and 15b samples the same analog input signal Vin. When the upper a bits obtained as the sampled value of ADC 13 are determined, switches S1 and S2 are switched, and ADC 14 receives result D13 of the upper a bits and sample value V15a or V15b of analog input signal Vin. This value has been sampled and held by S/H circuit 15a or 15b, and corresponds to the upper a bits.

ADC 14 compares reference voltages, each determined by the content of the upper a bits, with the voltage value (V15a or V15b) of the analog input signal, using $2^b - 1$ voltage comparators (10b), and converts the comparison results into a binary code, by way of an encoder (12b), to determine the lower b bits. The upper a bits from ADC 13 are delayed by delay circuit 16 by the time required to complete the A/D conversion in ADC 14 so as to be synchronized with the lower b bits from ADC 14, and are output as an n-bit binary code.

In this manner, while ADC 14 executes the A/D conversion, ADC 13 executes the A/D conversion of the next analog input signal, one of S/H circuits 15a and 15b holding the sample value of this analog input signal.

Figure 4:
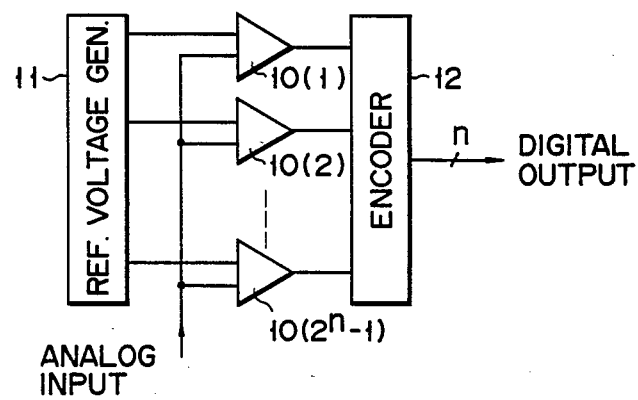
FIG. 4 is a diagram showing a conventional parallel A/D converter.

In this manner, upper- and lower-bit ADCs 13 and 14 are operated in a pipeline manner, with the result that the A/D conversion rate can be as high as that of the parallel A/D converter shown in FIG. 4. In addition, since the n-bit binary code is divided into upper a bits and lower b bits and the A/D conversion is executed, the total number of voltage comparators provided in this A/D converter is $2^a - 1 + 2^b - 1$, and can be greatly decreased as compared to the parallel A/D converter which requires $2^n - 1$ comparators.

For example, suppose that analog input signal Vin is converted into an 8-bit binary code (4 upper bits and 4 lower bits). Then, the parallel A/D converter shown in FIG. 4 requires 255 ($=2^8 - 1$) voltage comparators, while the A/D converter of the present invention requires only 30 voltage comparators ($=2^4 - 1 + 2^4 - 1$).

Figure 2:
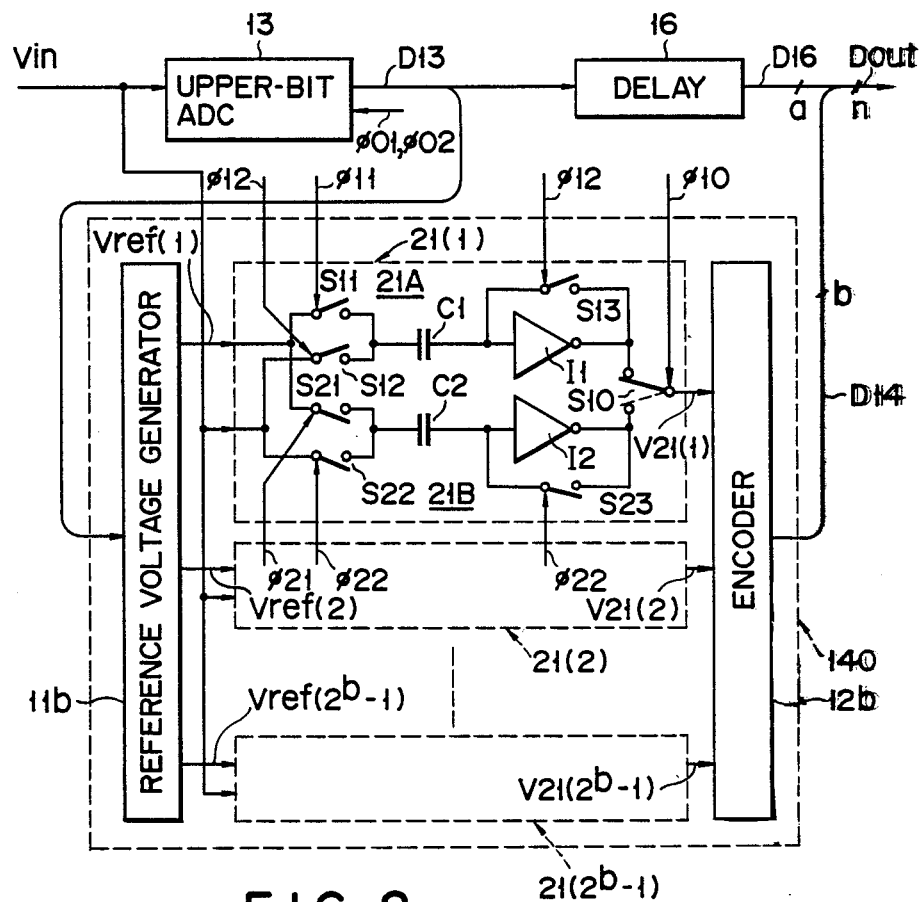
FIG. 2 is a block diagram showing in detail a main part of the A/D converter according to another embodiment of the invention.
Figure 3:
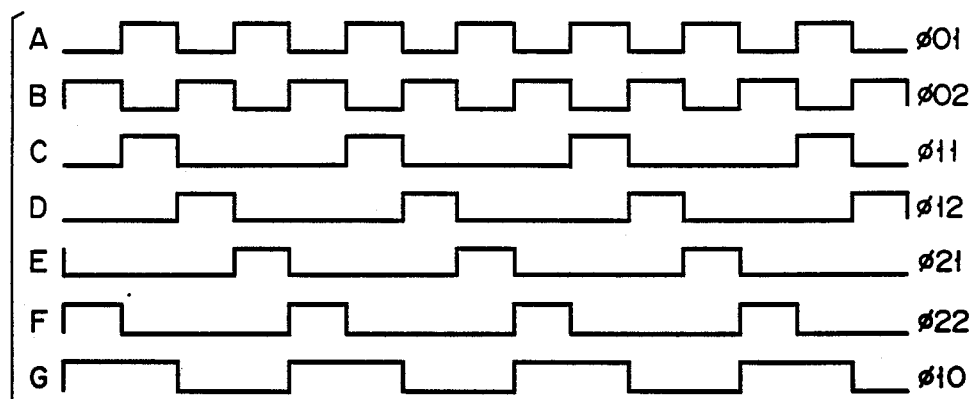
FIGS. 3A to 3G are timing charts for explaining the operation of the A/D converter shown in FIG. 2.

FIG. 2 shows an A/D converter according to another embodiment of the present invention. The A/D converter of this embodiment has basically the same arrangement as that of the A/D converter shown in FIG. 1, except that in place of independent S/H circuits 15a and 15b, two chopper voltage comparator sections 21A and 21B are arranged as $2^b - 1$ voltage comparators 21 provided in lower-bit ADC 140 for lower b bits, and have a sample-hold function.

Chopper voltage comparator section 21A comprises inverter I1, capacitor C1, and switches S11 to S13. Chopper voltage comparator section 21B comprises invertor I2, capacitor C2, and switches S21 to S23. The outputs from these voltage comparator sections are selected in alternate fashion, and the selected output is supplied to encoder 22.

Switches S10 to S13 and S21 to S23 are controlled by the clock signals shown in FIGS. 3A to 3G. In these figures, reference symbol $\phi11$ denotes a clock signal for controlling switches S11; $\phi12$, a clock signal for controlling switches S12 and S13; $\phi21$, a clock signal for controlling switch S21; $\phi22$, a clock signal for controlling switches S22 and S23; and $\phi10$, a clock signal for controlling switch S10. Reference symbols $\phi01$ and $\phi02$ (FIGS. 3A and 3B) denote control clock signals for upper-bit ADC 13, one period of clock signal $\phi01$ or $\phi02$ corresponding to the delay time of delay circuit 16.

When clock signal φ12 (FIG. 3D) goes to "1" level, switch S13 is turned on, and the potential at the input terminal of inverter I1 is set at threshold voltage VO of inverter I1. As a result of clock signal φ12 being at "1" level, switch S12 is also turned on, and voltage Vin of the analog input signal at that time is used to charge capacitor C1. Thus, voltage Vin-VO (corresponding to V15a in FIG. 1) is applied across capacitor C1. This is the sampling operation in voltage converter section 21A.

When clock signal φ12 goes to "0" level and switches S12 and S13 are turned off, the potential difference (Vin-VO) across capacitor C1 is temporarily fixed. For this reason, clock signal φ11 (FIG. 3C) goes to "1" level, and switch S11 is turned on. When value Vref(1) of a reference voltage supplied from reference voltage generator 11b is greater than voltage Vin of the sampled and held analog input signal, a "0"-level output is generated by inverter I1; otherwise, a "1"-level output is generated.

In this manner, when clock signal φ11 is at "1" level, voltage comparison between analog input signal Vin and reference voltage Vref(1) is performed. In this case, clock signal φ10 (FIG. 3G) is at "1" level, and switch S10 is switched to voltage comparator section 21A. Therefore, comparison result V21(1) is sent to encoder 12b.

Similarly, in voltage comparator section 21B, the sample-hold operation of an analog input signal is performed in response to clock signals φ21 and φ22 (FIGS. 3E and 3F), and comparison between the analog input signal (corresponding to V15b in FIG. 1) held in capacitor C2 and reference voltage signal Vref(1) is executed. When voltage comparison is performed in voltage comparator section 21B, clock signal φ10 goes to "0" level, and comparison result V21(1) is sent to encoder 12B via switch S10.

$2^b-1$ voltage comparators 21(1) to $21(2^b-1)$ have the same arrangement, except that values of reference voltages Vref(1) to $Vref(2^b-1)$ supplied thereto are different from each other. Therfore, ADCs 13 and 140 respectively corresponding to the upper a bits and the lower b bits can be operated in the pipelining manner in the same manner as in the A/D converter shown in FIG. 1, and hence, high-speed A/D conversion can be realized.

The number of voltage comparators in the embodiment shown in FIG. 2 is increased more than that in the A/D converter shown in FIG. 1. For example, when A/D conversion is performed for upper and lower 4 bits of an 8-bit binary code, the total number of comparators is $2^4-1+2^5-2=45$. However, the number of comparators (10) can be greatly reduced as compared to that of the parallel A/D converter shown in FIG. 4.

Note that the detailed arrangements of reference voltage generator 16 and encoder 12b can employ those disclosed in FIG. 2 (p.927) or FIG. 4 (p.929) of literature 1 and FIG. 2 (p.1140) of literature 2 presented in "Background of the Invention".

According to the present invention, the upper- and lower-bit ADCs can be operated in the pipelining manner. The same operating speed (sampling period) as in the parallel A/D converter can be obtained although the number of comparators is greatly reduced.

Figure 6:
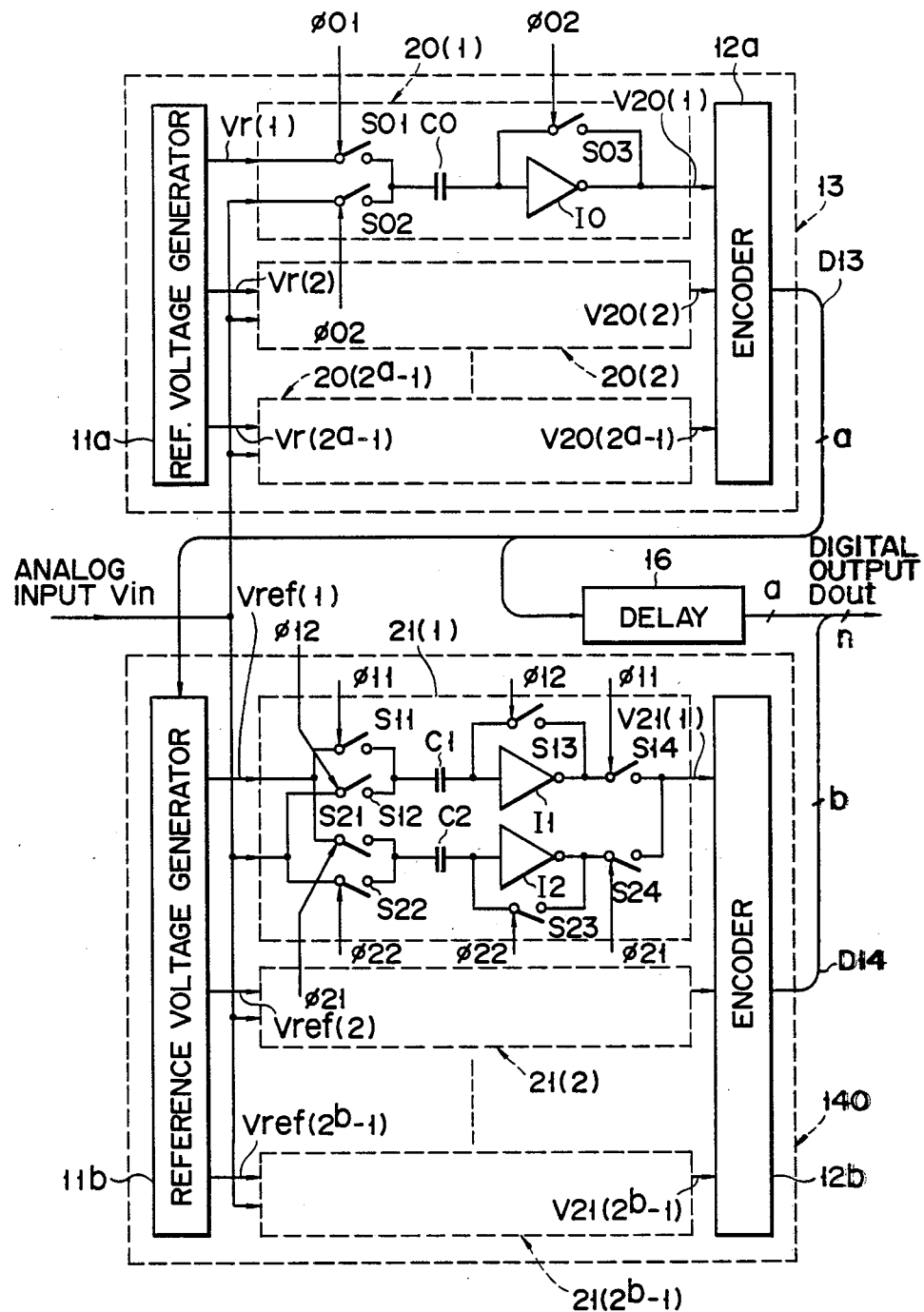
FIG. 6 is a block diagram showing in detail an arrangement of an A/D converter according to still another embodiment of the present invention.

FIG. 6 is a block diagram showing in detail the arrangement of an A/D converter according to another embodiment of the present invention. FIGS. 7A to 7F are timing charts for explaining the operation of the A/D converter shown in FIG. 6.

Figure 7:
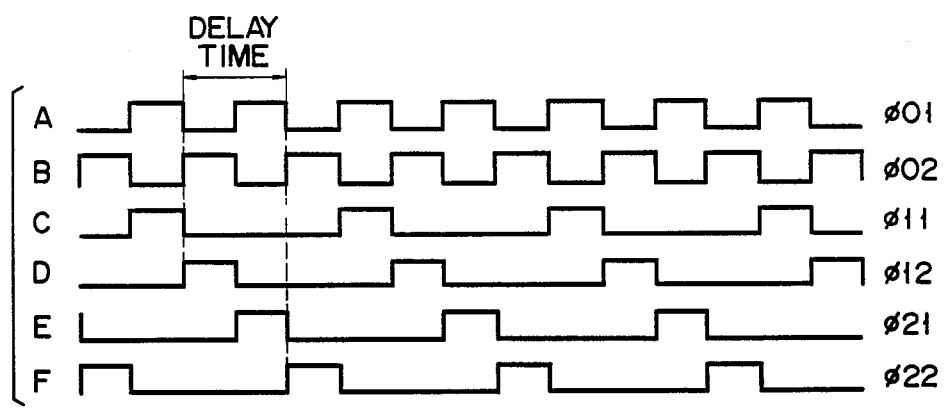
FIGS. 7A to 7F are timing charts for explaining the operation of the A/D converter shown in FIG. 6.

In FIG. 6, reference voltage generator 11a in upper-bit ADC 13 outputs $2^a-1$ reference voltages Vr(1) to $Vr(2^a-1)$. Reference voltage Vr(1) is supplied to one terminal of capacitor C0 through switch SO1 which is turned on/off in response to clock signal φ01 (FIG. 7A). The other terminal of capacitor C0 is connected to the input terminal of inverter I0. The output terminal of inverter I0 is connected to its input terminal through switch SO3 which is turned on/off in response to clock signal φ02 (FIG. 7B). Analog signal Vin to be A/D converted is supplied to one terminal of capacitor C0 through switch SO2 which is turned on/off in response to clock signal φ02.

Circuit components SO1 to SO3, C0, and I0 of voltage comparator 20(1) correspond to circuit components S11 to S13, C1, and I1 of voltage comparator section 21A shown in FIG. 2, and the circuit operation thereof is the same except for clock timings. Voltage comparator 20(1) supplies "1"-level signal V20(1) to encoder 12a when analog signal Vin exceeds reference voltage Vr(1).

Similarly, voltage comparator 20(2) supplies "1"-level signal V20(2) to encoder 12a when analog signal Vin exceeds reference voltage Vr(2). Voltage comparator $20(2^a-1)$ supplies "1"-level signal $V20(2^a-1)$ to encoder 12a when analog signal Vin exceeds reference voltage $Vr(2^a-1)$.

Encoder 12a supplies, to reference voltage generator 11b in lower-bit ADC 140, a-bit digital signal D13 corresponding to the combination of "1" levels of input signals V20(1) to $V20(2^a-1)$. Reference voltage generator 11b outputs $2^b-1$ reference voltages Vr(1) to $Vr(2^b-1)$ which change in proportion to the content (value) of signal D13.

The internal arrangement and the basic operation of ADC 140 shown in FIG. 6 are substantially the same as those of ADC 140 shown in FIG. 2. Note that switch S10 in FIG. 2 which is switched in response to clock signal φ10 corresponds to switches S14 and S24 which are switched in response to clock signals φ11 and φ21 (FIGS. 7C and 7E).

Upper a-bit digital signal D13 from ADC 13 is delayed by delay circuit 16 by one period of clock signal φ01 or φ02, and is output as n (=a+b) bit digital output Dout together with b-bit digital signal D14 from ADC 140.

FIG. 8 shows a schematic arrangement of an A/D converter according to still another embodiment of the present invention. In the embodiment shown in FIG. 1, the A/D conversion section is divided into two, but in the embodiment shown in FIG. 8, the A/D conversion section is divided into three.

More specifically, in the A/D converter of FIG. 8, for n-bit analog input signal Vin, A/D conversion of upper a bits is performed by upper-bit ADC 13, that of medium b bits is performed by medium-bit ADC 14, and that of lower c bits is performed by lower-bit ADC 19 (n=a+b+c).

Figure 10:
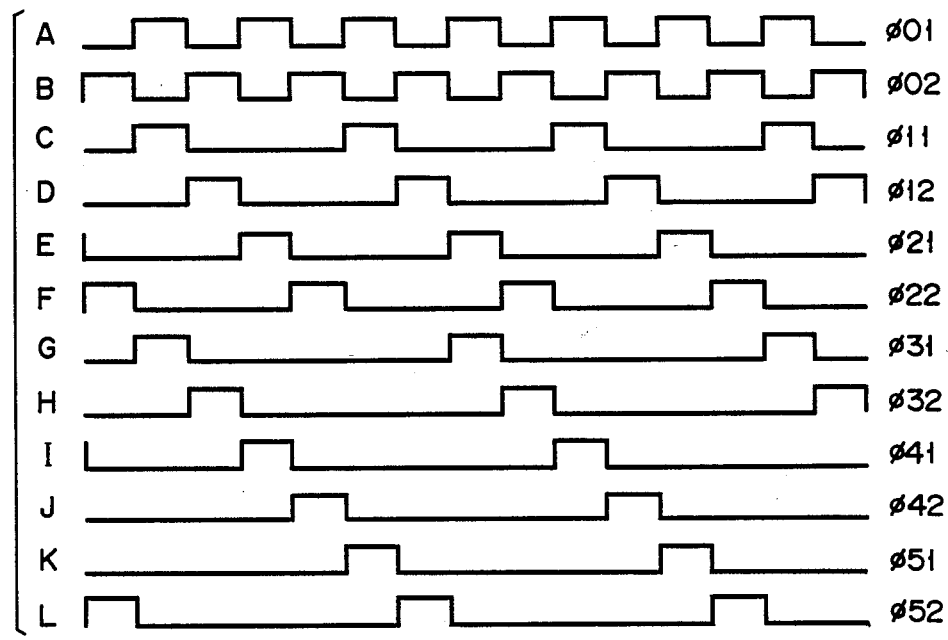
FIGS. 10A to 10L are timing charts for explaining the operation of the A/D converter shown in FIG. 9.

In FIG. 8, upper a bits of the digital conversion value of analog input Vin are obtained by ADC 13, and medium b bits thereof are obtained by ADC 14. Upper a-bit data D13 is delayed by delay circuit 16 by a time corresponding to one sampling clock (corresponding to one period of clock signal φ01 shown in FIG. 10) for the purpose of synchronization, and is synthesized with medium b-bit data D14.

Synthesized upper-medium a+b-bit data D140 is delayed by delay circuit 18 by a time corresponding to one sampling clock (corresponding to one period of clock signal $\phi01$ in FIG. 10) for the purpose of synchronization, and is then synthesized with lower c-bit data D19. Synthesized upper-medium-lower a+b+c-bit data serves as n-bit digital output Dout.

In the embodiment of FIG. 8, the arrangements and operations of upper- and medium-bit ADCs 13 and 14 are substantially the same as those of upper- and lower-bit ADCs 13 and 14 shown in FIG. 1.

The arrangement of lower-bit ADC 19 in FIG. 8 can be basically the same as that of lower-bit ADC 14 shown in FIG. 1. However, the operation timing of ADC 19 and that of sample-hold (S/H) circuits 17a to 17c used therewith are slightly different from those of ADC 14 in FIG. 1 and S/H circuits 15a and 15c used therewith.

Figure 9:
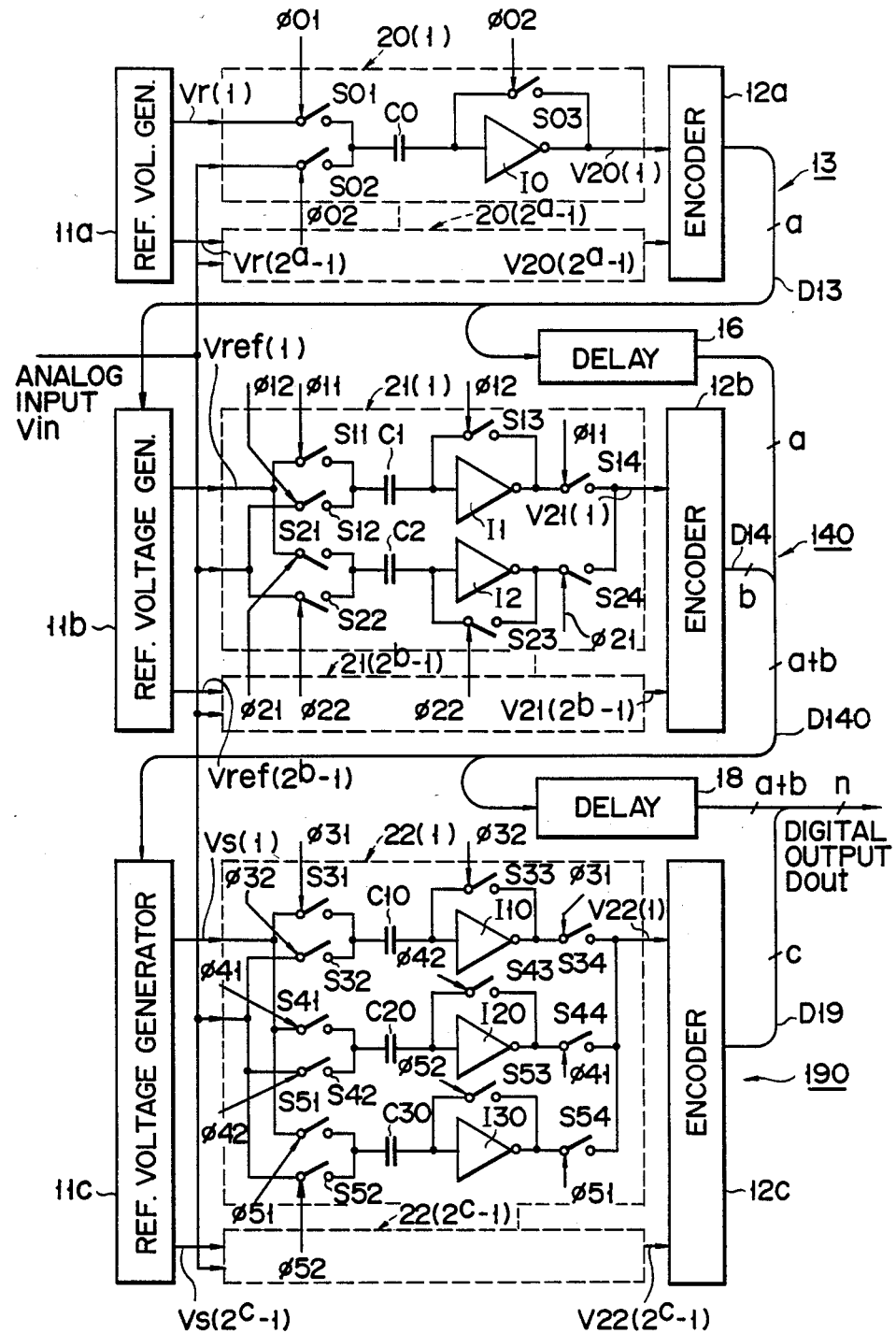
FIG. 9 is a block diagram showing in detail the arrangement of the A/D converter shown in FIG. 8.

The operation of lower-bit ADC 19 in FIG. 8 will be described with reference to the block diagram of FIG. 9 showing the detailed arrangement of the A/D converter of FIG. 8, and the timing charts of FIGS. 10A to 10L.

Note that circuit components 15a, 15b, 14b, S1, and S2 in FIG. 8 functionally correspond to medium-bit ADC 140 in FIG. 9, and circuit components 17a, 17b, 17c, 19b, S3, and S4 in FIG. 8 functionally correspond to lower-bit ADC 190 in FIG. 9.

Lower-bit ADC 190 for generating lower c-bit data is arranged as follows.

More specifically, in FIG. 9, reference voltage generator 11c in ADC 190 receives signal D140 as synthesized data of delayed data of a-bit digital signal D13 from encoder 12a and b-bit digital signal D14 from encoder 12b. Generator 11c outputs $2^c-1$ reference voltages Vs(1) to Vs($2^c-1$) which change proportional to the content (value) of signal D140.

Reference voltage Vs(1) is supplied to one terminal of capacitor C10 through switch S31 which is turned on/off in response to clock signal $\phi31$ (FIG. 10G). The other terminal of capacitor C10 is connected to the input terminal of inverter I10. Capacitor C10 holds a voltage corresponding to output V17a of S/H circuit 17a in FIG. 8. The output terminal of inverter I10 is connected to its input terminal through switch S33 which is turned on/off in response to clock signal $\phi32$ (FIG. 10H). Analog signal Vin to be A/D converted is supplied to one terminal of capacitor C10 through switch S32 which is turned on/off in response to clock signal $\phi32$.

Circuit components S31 to S33, C10, and I10 in voltage comparator 22(1) correspond to circuit components S11 to S13, C1, and I1 in voltage comparator section 21A shown in FIG. 2, and performs the same circuit operation except for clock timings. Circuit components S31 to S33, C10, and I10 of voltage comparator 22(1) supply "1"-level signal V22(1) to encode 12c when analog signal Vin exceeds reference voltage Vs(1) and clock signal $\phi31$ is input.

Note that switch S10 in FIG. 2 which is switched by clock signal $\phi10$ corresponds to switches S34, S44, and S54 which are switched in response to clock signals $\phi31$, $\phi41$, and $\phi51$ (FIGS. 10G, 10I, and 10K).

Reference voltage Vs(1) is also supplied to one terminal of capacitor C20 through switch S41 which is turned on/off in response to clock signal $\phi41$ (FIG. 10I). The other terminal of capacitor C20 is connected to the input terminal of inverter I20. Capacitor C20 holds a voltage corresponding to output V17b of S/H circuit 17b in FIG. 8. The output terminal of inverter I20 is connected to its input terminal through switch S43 which is turned on/off in response to clock signal $\phi42$ (FIG. 10J). Analog signal Vin is supplied to one terminal of capacitor C20 through switch S42 which is turned on/off in response to clock signal $\phi42$.

Circuit components S41 to S43, C20, and I20 in voltage comparator 22(1) have the same arrangement as that of circuit components S31 to S33, C10, and I10, and perform the same circuit operation except for clock timings. Circuit components S41 to S43, C20, and I20 in voltage comparator 22(1) supply "1"-level signal V22(1) to encoder 12c when analog signal Vin exceeds Vs(1) and clock signal $\phi41$ is input.

Reference voltage Vs(1) is also supplied to one terminal of capacitor C30 through switch S51 which is turned on/off in response to clock signal $\phi51$ (FIG. 10K). The other terminal of capacitor C30 is connected to the input terminal of inverter I30. Capacitor C30 holds a voltage corresponding to output V17c of S/H circuit 17c in FIG. 8. The output terminal of inverter I30 is connected to its input terminal through switch S53 which is turned on/off in response to clock signal $\phi52$ (FIG. 10L). Analog signal Vin is supplied to one terminal of capacitor C30 through switch S52 which is turned on/off in response to clock signal $\phi52$.

Circuit components S51 to S53, C30, and I30 of voltage comparator 22(1) also have the same arrangement as that of circuit components S31 to S33, C10, and I10, and perform the same circuit operation except for clock timings. Circuit components S51 to S53, C30, and I30 of voltage comparator 22(1) supply "1"-level signal V22(1) to encoder 12c when analog signal Vin exceeds reference voltage Vs(1) and clock signal $\phi51$ is input.

Similarly, voltage comparator 22($2^c-1$) supplies "1"-level signal V22($2^c-1$) to encoder 12c when analog signal Vin exceeds reference voltage Vs($2^c-1$) and clock signals corresponding to clocks $\phi31$ to $\phi51$ are received. Encoder 12c outputs c-bit digital signal D19 corresponding to a combination of "1" levels of input signals V(1) to V22($2^c-1$).

Lower c-bit digital signal from ADC 190 is output as n (=a+b+c)-bit digital output Dout together with a+b-bit digital signal D140 which is output from ADC 140 and is delayed by delay circuit 18 by one period of clock signal $\phi01$ or $\phi02$.

In the arrangement of FIG. 9, the number of comparators (20 to 22) is larger than that of FIG. 2 or 6, but is greatly reduced as compared to the arrangement shown in FIG. 4. Further, the A/D conversion rate of the arrangement of FIG. 9 can be as high as that obtained by the arrangement of FIG. 2 or 6.

Incidentally, in the arrangement of FIG. 9, the value of Vref(1) applied to switch S11 may differ from that applied to switch S21. Similarly, the values respectively applied to switches S31, S41, and S51 may be different from one another.

Other arrangements of voltage comparators (20 to 22) will be described in detail with reference to the drawings from FIG. 11.

Figure 11:
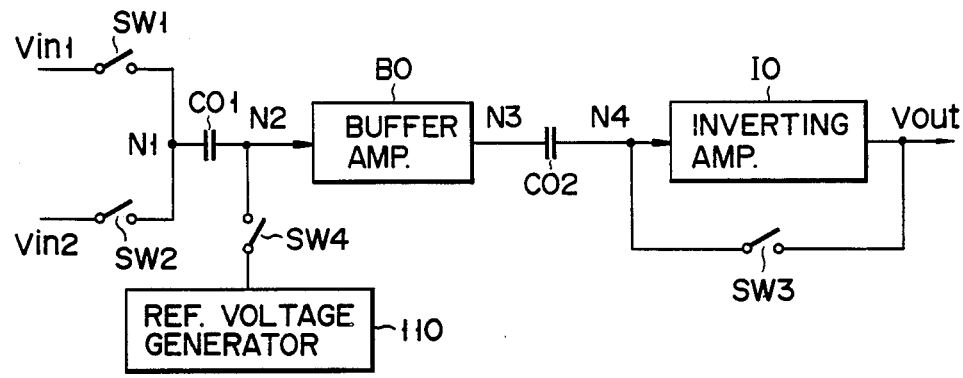
FIG. 11 is a circuit diagram showing a modification of a voltage comparator (21) as shown in FIG. 2, etc.

Referring to FIG. 11, reference symbol SW1 denotes a first switch which receives first analog input signal Vin1; and SW2, a second switch which receives second analog input signal Vin2. The output terminals of Switches SW1 and SW2 are connected to each other, and the node therebetween is connected to one terminal (node N1) of first capacitor C01. The other terminal (node N2) of first capacitor CO1 is connected to buffer amplifier BO having a high input impedance/low output impedance. The output terminal of buffer amplifier BO is connected to one terminal (node N3) of second capacitor CO2. The other terminal (node N4) of second capacitor CO2 is connected to the input terminal of inverting amplifier IO.

Third switch SW3 is connected between the input and output terminals of invertion amplifier IO. Furthermore, the other terminal (N2) of first capacitor CO1 is connected to reference voltage generator 110 through fourth switch SW4.

Figure 12:
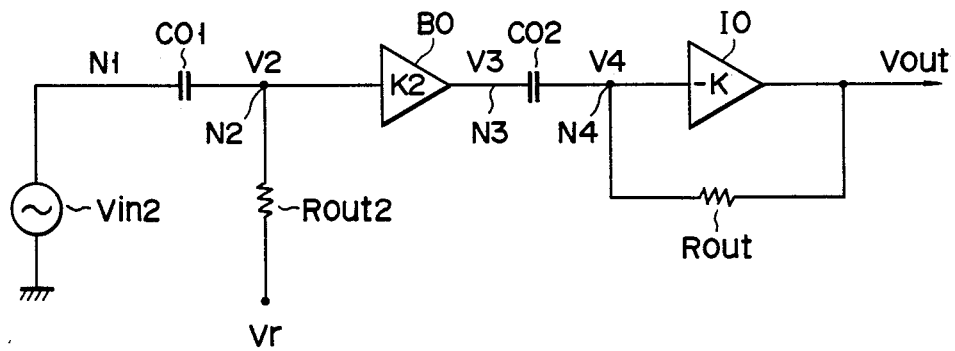
FIG. 12 shows an equivalent circuit for explaining the operation of the circuit of FIG. 11.

The operation of the voltage comparator shown in FIG. 11 will be described below. When second, third, and fourth switches SW2, SW3, and SW4 are turned on and first switch SW1 is turned off, the equivalent circuit is represented as shown in FIG. 12. Note that reference symbol Vin2 denotes an input signal source; Rout, a resistor between the input and output terminals of inverting amplifier IO, including the ON resistance of third switch SW3; and Rout2, an equivalent internal resistor of generator 110, including the ON resistance of fourth switch SW4. The voltage at the input terminal (N4) of inverting amplifier IO is converged to operating point voltage Vop since output voltage Vout (V20, V21, or V22) is negatively fed back thereto.

In order to perform high-precision voltage comparison, voltage V4 at node N4 must be precisely converged to operating point voltage Vop when third switch SW3 is ON.

Figure 29:
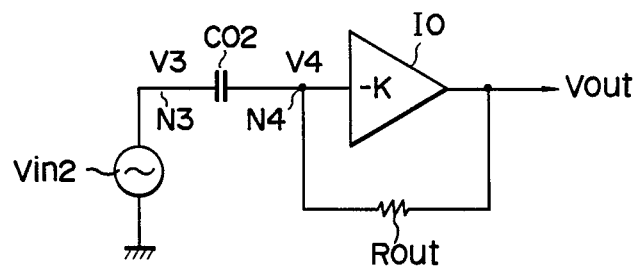
FIG. 29 shows an equivalent circuit for explaining the advantages of the circuit shown in FIG. 11.

Assuming that input Vin2 is directly supplied to node N3 without capacitor CO1 and buffer BO, as shown in FIG. 29, Vin is given as a sine wave having angular frequency $\omega$, and Vop=0, a steady solution (i.e., a solution after a sufficient time has passed from when switch SW3 was turned on) is calculated:

$$V4 = \frac{j\omega CO2 Rout}{1 + K + j\omega CO2 Rout} \times |Vin2| \qquad (1)$$

where V4 is a voltage at the input terminal of inverting amplifier IO having gain "$-K$", and $|Vin2|$ is an amplitude of Vin2 (=V3) represented by:

$$Vin2 = |Vin2| e^{j\omega t}$$

(j indicates a complex number, and t indicates time) Voltage V4 at the input terminal of inverting amplifier IO must coincide with Vop. However, an error with respect to Vop occurs by a value obtained by subtracting Vop (=0) from V4 of equation (1). When $\omega = 0$, i.e., Vin2 is a DC voltage, then V4=0, and an error is zero. However, if $\omega$ is increased, a steady error is increased accordingly.

In order to reduce the error, CO2, Rout, and Vin2 can be considered to be reduced. However, it is difficult to reduce CO2 and Rout from the technical point of view. If $|Vin2|$ is decreased, an input signal to inverting amplifier IO in the voltage comparator is decreased, and the precision of the voltage comparator must be improved.

Referring again to FIG. 12, assuming that Vin2 is given as a sine wave having angular frequency $\omega$, and output voltage Vr and operating point voltage Vop in the no-load state of generator 110 are respectively 0 V, a steady solution (a solution after a sufficient time has passed from when second, third, and fourth switches SW2 to SW4 are turned on) is calculated. Voltage V2 at the output terminal (node N2) of first capacitor CO1 is represented by:

$$V2 = \frac{j\omega CO1 Rout2}{1 + j\omega CO1 Rout2} \times |Vin2| + Vr \qquad (2)$$

Voltage V3 at the input terminal (node N3) of second capacitor CO2 is represented by:

$$V3 = K2 \left\{ \frac{1 + j\omega CO1 Rout2}{1 + j\omega CO1 Rout2} \times |Vin2| + Vr \right\} \qquad (3)$$

where K2 is a voltage gain of buffer amplifier BO.

If the voltage gain of inverting amplifier IO is represented by "$-K$" ($K>0$), voltage V4 at the output terminal (node N4) of second capacitor CO2, i.e., at the input terminal of inverting amplifier IO, is represented by:

$$V4 = V3 \times \frac{j\omega CO2 Rout}{K + 1 + j\omega CO2 Rout} \qquad (4)$$

In this case, potential difference Vc1 across first capacitor CO1 and potential difference Vc2 across second capacitor CO2 are respectively represented by:

$$Vc1 = V2 - Vin2 \qquad (5)$$

$$Vc2 = V3 \times \left( \frac{j\omega CO2 Rout}{K + 1 + j\omega CO2 Rout} - 1 \right) \qquad (6)$$

In contrast to the above, when second, third, and fourth switches SW2, SW3, and SW4 are turned off and first switch SW1 is turned on, voltage V2 at node N2 and voltage V4 at node N4 are respectively represented by:

$$V2 = Vc1 + Vin1 \qquad (7)$$

$$V4 = K2 \left\{ (Vin1 - Vin2) + \left( \frac{j\omega CO1 Rout2}{1 + j\omega CO1 Rout2} \right) \left( \frac{j\omega CO2 Rout}{K + 1 + j\omega CO2 Rout} \right) \times Vin2 \right\} \qquad (8)$$

The second term of equation (8) corresponds to the error of the voltage comparison operation. However, this error is decreased as compared to that of equation (1) by:

$$\left| K2 \left( \frac{j\omega CO1 Rout2}{1 + j\omega CO1 Rout2} \right) \right| \qquad (9)$$

Relation (9) takes a value equal to or smaller than 1, and can be set to be sufficiently smaller than 1 in practice. For this reason, the error can be suppressed to a negligible level. For example, if $|K2|=1$, CO1=1 pF, Rout2=2$\Omega$k, and $\omega = 2\pi \times 4 \times 10^6$ rad/sec (=4 MHz), the value of relation (9) is about 0.05. If the second term of equation (8) is ignored in a practical application, since Vout=$-K \times V4$, output voltage Vout of inverting amplifier IO is given as:

$$V_{out} = -K \times K2(V_{in1} - V_{in2}) \qquad (10)$$

Thus, output Vout obtained by amplifying the potential difference between input signals Vin1 and Vin2 can be obtained. More specifically, the relationship between Vin1 and Vin2 (voltage comparison result) can be obtained based on the signal level of Vout.

According to the voltage comparator shown in FIG. 11, almost the input signal voltage is held in first capacitor CO1 which is charged by a potential difference (Vc1 in equation (5)) between an input signal (Vin2) and reference voltage generator 110. An AC component (Vc2 in equation (6)) can be minimized by a potential difference (V3−Vop) between output V3 of buffer amplifier BO which receives an output from generator 110, and the operating point voltage (v4=Vop) of inverting amplifier IO, and by little input signal components which overflows from first capacitor CO1. For this reason, the input terminal of inverting amplifier IO is set at operating point voltage Vop. Even if input signal Vin2 is a high-frequency signal of MH2 order, it can be temporarily held. Thus, voltage comparison between the held voltage (Vin2) and another input signal Vin1 can be satisfactorily performed.

Inverting amplifier IO can have various arrangements, as shown in FIGS. 13 to 17. Buffer amplifier BO can have various arrangements, as shown in FIGS. 18 to 23.

Figure 13:
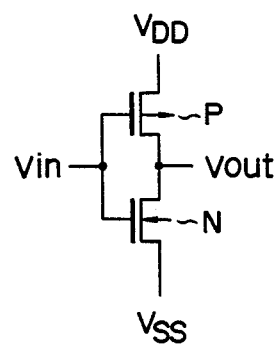
Figure 14:
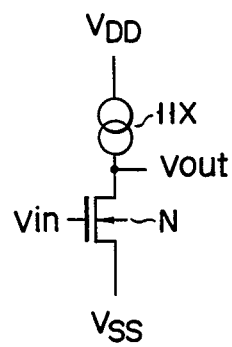
Figure 15:
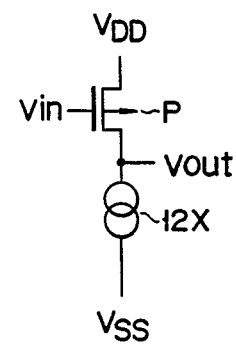

An inverting amplifier shown in FIG. 13 is a CMOS inverter in which p- and n-channel transistors P and N are connected in series with each other, and their gates are commonly connected. An inverting amplifier shown in FIG. 14 is an n-channel MOS inverter in which constant current source 11X and N-channel transistor N are connected in series with each other. An inverting amplifier shown in FIG. 15 is a p-channel MOS inverter in which p-channel MOS transistor P and current source 12X are connected in series with each other. An inverting amplifier shown in FIG. 16 is a p-channel MOS inverter in which p-channel transistor P and resistor R are connected in series with each other. An inverting amplifier shown in FIG. 17 is an n-channel MOS inverter in which resistor R and n-channel MOS transistor N are connected in series with each other.

In a buffer amplifier shown in FIG. 18, load p-channel transistor P the drain and gate of which are connected to each other is connected in series with n-channel transistor N. In a buffer amplifier shown in FIG. 19, p-channel transistor P is connected in series with n-channel transistor N, the gate and drain of which are connected to each other. A buffer amplifier shown in FIG. 20 is constituted by cascade-connecting n-channel inverter IVN in which current source 11X is connected in series with n-channel transistor N, and p-channel inverter IVP in which p-channel transistor P is connected in series with current source 12X. In a buffer amplifier shown in FIG. 21, the connection relationship between n- and p-channel inverters IVN and IVP is reversed to that of FIG. 20. A buffer amplifier shown in FIG. 12 is constituted by cascade connecting the buffer amplifiers shown in FIGS. 18 and 19. A buffer amplifier shown in FIG. 23 has the connection relationship of the circuits reversed to that of FIG. 22.

Constant current sources 11X and 12X are realized by applying bias voltage VB or VB* to the gate of a p-or n-channel transistor, as shown in FIGS. 24 and 25.

Reference voltage generator 110 in FIG. 11 need only supply a constant voltage for at least a predetermined period of time while switch SW4 is kept on, and may employ either arrangement as follows. As shown in FIG. 26A, p-channel transistor P, the gate and drain of which are connected to each other, is connected in series with n-channel transistor N, the drain and gate of which are connected to each other. As shown in FIG. 26B, voltage-dividing resistors R1 and R2 are series-connected between the VDD and VSS power supply nodes.

Figures 27A, 27B:
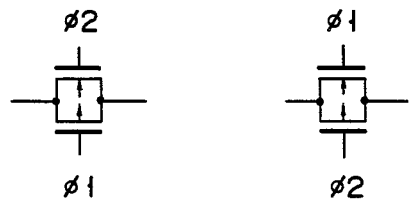

Second, third, and fourth switches SW2, SW3, and SW4 in FIG. 11 need only be CMOS switches (transfer gates) to which complementary clock signals 1 and 2 are supplied as gate signals, as shown in FIG. 27A. Switch SW1 can be a CMOS switch (FIG. 27B) to which clock signals $\phi 2$ and $\phi 1$ complementarily to switches SW2 to SW4 are supplied as gate signals.

Note that the input bias of buffer amplifier BO in the modification shown in FIG. 11 is supplied from reference voltage generator 110. When the input bias can be a ground potential (normally, 0V), reference voltage generator 110 can be a ground potential terminal. When buffer amplifier BO in the voltage comparator shown in FIG. 11 is omitted like in the voltage comparator shown in FIG. 28, this circuit is equivalent to a circuit wherein K2=1, and the same advantages can be expected. In this case, although the circuit arrangement can be simplified, charges are migrated between capacitors CO1 and CO2 due to a stray capacitance of the input terminal of inverting amplifier IO. Therefore, the voltage comparator shown in FIG. 11 has better sensitivity than that of FIG. 28.

Figure 28:
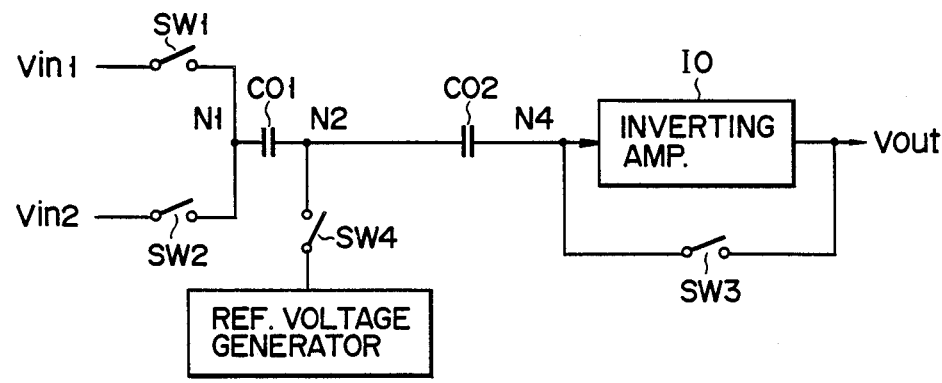
FIG. 28 is a circuit diagram showing a modification of a voltage comparator (21) as shown in FIG. 11, etc.

As described above, according to the voltage comparators shown in FIGS. 11 and 28, even if a signal input is a high-frequency signal, it can be held in a capacitor with high precision, and voltage comparison between the held signal (Vin2) and a reference signal (Vin1) can be satisfactorily performed. Addition of buffer amplifier BO allows an improvement of the sensitivity of the voltage comparator. The voltage comparators shown in FIGS. 11 and 28 are suitable for an an A/D converter for a high-frequency signal such as a television signal.

What is claimed is:

1. An A/D converter for converting an analog input signal into a digital output signal having an n-bit binary code, wherein n, a, and b are positive integers, and n=a+b, and comprising:

first A/D conversion means for A/D-converting the analog input signal into a first digital output corresponding to upper a-bit data of the n-bit digital output signal;

first sample-hold means for sampling a signal level of the analog input signal and outputting a first hold signal;

second sample-hold means for sampling a signal level of the analog input signal and outputting a second hold signal;

first switching means for, in synchronism with the A/D conversion operation of said first A/D conversion means, selecting the second hold signal from said second sample-hold means during a period in which said first sample-hold means samples the signal level of the analog input signal, and selecting the first hold signal from said first sample-hold means during a period in which said second sample-hold means samples the signal level of the analog input signal;

second A/D conversion means for A/D-converting one of the first and second hold signals selected by said first switching means, and outputting a second digital output corresponding to lower b-bit data of the n-bit digital output signal, said first and second digital outputs being combined to provide said n-bit digital output signal; and delay means connected to said first A/D conversion means for delaying the first digital output until A/D conversion is completed by said second A/D conversion means, thereby synchronizing the first digital output from said first A/D conversion means to the second digital output from said second A/D conversion means.

2. An A/D converter according to claim 1, wherein n, a, b, and c are positive integers, and n=a+b+c, and further comprising:

third sample-hold means for sampling a signal level of the analog input signal and outputting a third hold signal;

fourth sample-hold means for sampling a signal level of the analog input signal and outputting a fourth hold signal;

fifth sample-hold means for sampling a signal level of the analog input signal and outputting a fifth hold signal;

second switching means for, in synchronism with the A/D conversion operation of said first A/D conversion means, selecting the fifth hold signal from said fifth sample-hold means during a period in which one of said third and fourth sample-hold means samples the signal level of the analog input signal, selecting the fourth hold signal from said fourth sample-hold means during a period in which one of said fifth and third sample-hold means samples the signal level of the analog input signal, and selecting the third hold signal from said third sample-hold means during a period in which one of said fourth and fifth sample-hold means samples the signal level of the analog input signal; and third A/D conversion means for A/D-converting one of the third through fifth hold signals selected by said second switching means, and outputting a third digital output corresponding to further lower c-bit data of the n-bit digital output signal, said first through third digital outputs being combined to provide said n-bit digital output signal.

3. An A/D converter according to claim 1, wherein said second A/D conversion means includes:

voltage comparison means, coupled to said first A/D conversion means, for alternately comparing a first reference voltage with one of said first and second hold signals, said first reference voltage being changed in accordance with a content of the first digital output.

4. An A/D converter according to claim 1, wherein said first A/D conversion means includes:

first reference voltage generator means for generating a plurality of first reference voltages;

a first chopper comparator, coupled to said first reference voltage generator means, and being alternatively responsive to said analog input signal and one of said first reference voltages, for providing a first comparison output as a result of comparison between said analog input signal and one of said first reference voltages; and first encoder means, coupled to said first chopper comparator, for encoding said first comparison output, to provide said first digital output, and wherein said second A/D conversion means includes:

second reference voltage generator means, coupled to said first A/D conversion means, for generating a plurality of second reference voltages the value of each of which depends on contents of said first digital output;

a second chopper comparator, coupled to said second reference voltage generator means, and being alternatively responsive to said analog input signal and one of said second reference voltages, for providing a second comparison output as a result of comparison between said analog input signal and one of said second reference voltages;

a third chopper comparator, coupled to said second reference voltage generator means, and being alternatively responsive to said analog input signal and another one of said second reference voltages, for providing a third comparison output as a result of comparison between said analog input signal and another one of said second reference voltages, said third chopper comparator being coupled in parallel to said second chopper comparator; and second encoder means, coupled to said second and third chopper comparators, for encoding said second and third comparison outputs, to provide said second digital output;

wherein each of said chopper comparators includes:

first switch means for selectively supplying a comparison reference signal to one terminal of a first capacitor;

second switch means for selectively supplying a signal to be compared to said one terminal of said first capacitor;

a second capacitor, one terminal of which is connected to the other terminal of said first capacitor;

an inverting amplifier, an input terminal of which is connected to the other terminal of said second capacitor;

third switch means for selectively connecting the input and output terminals of said inverting amplifier; and fourth switch means for selectively supplying a predetermined voltage to said other terminal of said first capacitor.

5. An A/D converter according to claim 2, wherein said second A/D conversion means includes:

first voltage comparison means, coupled to said first A/D conversion means, for alternately comparing a first reference voltage, which changes in accordance with a content of the first digital output, with one of said first and second hold signals, and wherein said third A/D conversion means includes:

second voltage comparison means, coupled to said first and second A/D conversion means, for sequentially comparing a second reference voltage, which changes in accordance with contents of the first and second digital outputs, with one of the first through third hold signals.

6. An A/D converter according to claim 2, wherein said first A/D conversion means includes:

first reference voltage generator means for generating a plurality of first reference voltages;

a first chopper comparator, coupled to said first reference voltage generator means, and being alternatively responsive to said analog input signal and one of said first reference voltages, for providing a first comparison output as a result of comparison between said analog input signal and one of said first reference voltages; and first encoder means, coupled to said first chopper comparator, for encoding said first comparison output to provide said first digital output, wherein said second A/D conversion means includes:

second reference voltage generator means, coupled to said first A/D conversion means, for generating a plurality of second reference voltages the value of each of which depends on contents of said first digital output;

a second chopper comparator, coupled to said second reference voltage generator means, and being alternatively responsive to said analog input signal and one of said second reference voltages, for providing a second comparison output as a result of comparison between said analog input signal and one of said second reference voltages;

a third chopper comparator, coupled to said second reference voltage generator means, and being alternatively responsive to said analog input signal and one of said second reference voltages, for providing a third comparison output as a result of comparison between said analog input signal and one of said second reference voltages, said third chopper comparator being coupled in parallel to said second chopper comparator; and second encoder means, coupled to said second and third chopper comparators, for encoding said second and third comparison output, to provide said second digital output, and wherein said third A/D conversion means includes:

third reference voltage generator means, coupled to said second A/D conversion means, for generating a plurality of third reference voltages the value of each of which depends on contents of said first and second digital outputs;

a fourth chopper comparator, coupled to said third reference voltage generator means, and being alternatively responsive to said analog input signal and one of said third reference voltages, for providing a fourth comparison output as a result of comparison between said analog input signal and one of said third reference voltages;

a fifth chopper comparator, coupled to said third reference voltage generator means, and being alternatively responsive to said analog input signal and one of said third reference voltages, for providing a fifth comparison output as a result of comparison between said analog input signal and one of said third reference voltages;

a sixth chopper comparator, coupled to said third reference voltage generator means, and being alternatively responsive to said analog input signal and one of said third reference voltages, for providing a sixth comparison output as a result of comparison between said analog input signal and one of said third reference voltages, said fourth, fifth, and sixth chopper comparators being coupled in parallel to one another; and third encoder means, coupled to said fourth, fifth, and sixth chopper comparators, for encoding said fourth, fifth and sixth comparison outputs, to provide said third digital output;

wherein each of said chopper comparators includes:

first switch means for selectively supplying a comparison reference signal to one terminal of a first capacitor;

second switch means for selectively supplying a signal to be compared to said one terminal of said first capacitor;

a second capacitor, one terminal of which is connected to the other terminal of said first capacitor;

an inverting amplifier, an input terminal of which is connected to the other terminal of said second capacitor;

third switch means for selectively connecting the input and output terminals of said inverting amplifier; and fourth switch means for selectively supplying a predetermined voltage to said other terminal of said first capacitor.

7. An A/D converter according to claim 4, wherein at least one of said first, second, and third chopper comparators includes:

first switch means for selectively supplying a comparison reference signal to one terminal of a first capacitor;

second switch means for selectively supplying a signal to be compared to said one terminal of said first capacitor;

a buffer amplifier, an input terminal of which is connected to the other terminal of said first capacitor, and which has a high input impedance and a low output impedance;

a second capacitor, one terminal of which is connected to an output terminal of said buffer amplifier;

an inverting amplifier an input terminal of which is connected to the other terminal of said second capacitor;

third switch means for selectively connecting the input and output terminals of said inverting amplifier; and fourth switch means for selectively supplying a predetermined voltage to said other terminal of said first capacitor.

8. An A/D converter according to claim 6, wherein at least one of said first through sixth chopper comparators includes:

first switch means for selectively supplying a comparison reference signal to one terminal of a first capacitor;

second switch means for selectively supplying a signal to be compared to said one terminal of said first capacitor;

a buffer amplifier, an input terminal of which is connected to the other terminal of said first capacitor, and which has a high input impedance and a low output impedance;

a second capacitor, one terminal of which is connected to an output terminal of said buffer amplifier;

an inverting amplifier, an input terminal of which is connected to the other terminal of said second capacitor;

third switch means for selectively connecting the input and output terminals of said inverting amplifier; and fourth switch means for selectively supplying a predetermined voltage to said other terminal of said first capacitor.

9. An A/D converter for converting an analog input signal into a digital output signal having an n-bit binary code, wherein n, a, and b are positive integers, and n=a+b, comprising:

first A/D conversion means for A/D-converting the analog input signal into a first digital output corresponding to upper a-bit data of the n-bit digital output signal;

first sample-hold means for sampling a signal level of the analog input signal and outputting a first hold signal;

second sample-hold means for sampling a signal level of the analog input signal and outputting a second hold signal;

first switching means for, in synchronism with the A/D conversion operation of said first A/D conversion means, selecting the second hold signal from said second sample-hold means during a period in which said first sample-hold means samples the signal level of the analog input signal, and selecting the first hold signal from said first sample-hold means during a period in which said second sample-hold means samples the signal level of the analog input signal; and second A/D conversion means for A/D-converting one of the first and second hold signals selected by said first switching means, and outputting a second digital output corresponding to lower b-bit data of the n-bit digital output signal, said first and second digital outputs being combined to provide said n-bit digital output signal;

wherein said second A/D conversion means includes:

(a) a first reference voltage generator, connected to said first A/D conversion means, for generating a first reference signal which changes in accordance with a content of the first digital output;

(b) a plurality of first voltage comparators, each of which includes a first switch for selectively supplying the first reference signal to one terminal of a first capacitor, a second switch for selectively supplying the analog input signal to said one terminal of said first capacitor, a first inverter, an input terminal of which is connected to the other terminal of said first capacitor, a third switch for selectively connecting the input and output terminals of said first inverter, a fourth switch for selectively supplying the first reference signal to one terminal of a second capacitor, a fifth switch for selectively supplying the analog input signal to said one terminal of said second capacitor, a second inverter, an input terminal of which is connected to the other terminal of said second capacitor, and a sixth switch for selectively connecting the input and output terminals of said second inverter; and (c) an encoder for converting the comparison results from said plurality of first voltage comparators into the second digital output.

10. An A/D converter for converting an analog input signal into a digital output signal having an n-bit binary code, wherein n, a, b, and c are positive integers, and n=a+b+c, comprising:

first A/D conversion means for A/D-converting the analog input signal into a first digital output corresponding to upper a-bit data of the n-bit digital output signal;

first sample-hold means for sampling a signal level of the analog input signal and outputting a first hold signal;

second sample-hold means for sampling a signal level of the analog input signal and outputting a second hold signal;

third sample-hold means for sampling a signal level of the analog input signal and outputting a third hold signal;

fourth sample-hold means for sampling a signal level of the analog input signal and outputting a fourth hold signal;

fifth sample-hold means for sampling a signal level of the analog input signal and outputting a fifth hold signal;

first switching means for, in synchronism with the A/D conversion operation of said first A/D conversion means, selecting the second hold signal from said second sample-hold means during a period in which said first sample-hold means samples the signal level of the analog input signal, and selecting the first hold signal from said first sample-hold means during a period in which said second sample-hold means samples the signal level of the analog input signal;

second A/D conversion means for A/D-converting one of the first and second hold signals selected by said first switching means, and outputting a second digital output corresponding to lower b-bit data of the n-bit digital output signal;

second switching means for, in synchronism with the A/D conversion operation of said first A/D conversion means, selecting the fifth hold signal from said fifth sample-hold means during a period in which one of said third and fourth sample-hold means samples the signal level of the analog input signal, selecting the fourth hold signal from said fourth sample-hold means during a period in which one of said fifth and third sample-hold means samples the signal level of the analog input signal, and selecting the third hold signal from said third sample-hold means during a period in which one of said fourth and fifth sample-hold means samples the signal level of the analog input signal; and third A/D conversion means for A/D-converting one of the third through fifth hold signals selected by said second switching means, and outputting a third digital output corresponding to further lower c-bit data of the n-bit digital output signal, said first through third digital outputs being combined to provide said n-bit digital output signal;

wherein said second A/D conversion means includes:

(a) a first reference voltage generator, connected to said first A/D conversion means, for generating a first reference signal which changes in accordance with a content of the first digital output;

(b) a plurality of first voltage comparators, each of which includes a first switch for selectively supplying the first reference signal to one terminal of a first capacitor, a second switch for selectively supplying the analog input signal to said one terminal of said first capacitor, a first inverter, an input terminal of which is connected to the other terminal of said first capacitor, a third switch for selectively connecting the input and output terminals of said first inverter, a fourth switch for selectively supplying the first reference signal to one terminal of a second capacitor, a fifth switch for selectively supplying the analog input signal to said one terminal of said second capacitor, a second inverter, an input terminal of which is connected to the other terminal of said second capacitor, and a sixth switch for selectively connecting the input and output terminals of said second inverter; and (c) an encoder for converting the comparison results from said plurality of first voltage comparators into the second digital output.

11. An A/D converter for converting an analog input signal into a digital output signal having an n-bit binary code, wherein n, a, b, and c are positive integers, and n=a+b+c, comprising:

first A/D conversion means for A/D-converting the analog input signal into a first digital output corresponding to upper a-bit data of the n-bit digital output signal;

first sample-hold means for sampling a signal level of the analog input signal and outputting a first hold signal;

second sample-hold means for sampling a signal level of the analog input signal and outputting a second hold signal;

third sample-hold means for sampling a signal level of the analog input signal and outputting a third hold signal;

fourth sample-hold means for sampling a signal level of the analog input signal and outputting a fourth hold signal;

fifth sample-hold means for sampling a signal level of the analog input signal and outputting a fifth hold signal;

first switching means for, in synchronism with the A/D conversion operation of said first A/D conversion means, selecting the second hold signal from said second sample-hold means during a period in which said first sample-hold means samples the signal level of the analog input signal, and selecting the first hold signal from said first sample-hold means during a period in which said second sample-hold means samples the signal level of the analog input signal;

second A/D conversion means for A/D-converting one of the first and second hold signals selected by said first switching means, and outputting a second digital output corresponding to lower b-bit data of the n-bit digital output signal;

second switching means for, in synchronism with the A/D conversion operation of said first A/D conversion means, selecting the fifth hold signal from said fifth sample-hold means during a period in which one of said third and fourth sample-hold means samples the signal level of the analog input signal, selecting the fourth hold signal from said fourth sample-hold means during a period in which one of said fifth and third sample-hold means samples the signal level of the analog input signal, and selecting the third hold signal from said third sample-hold means during a period in which one of said fourth and fifth sample-hold means samples the signal level of the analog input signal; and third A/D conversion means for A/D-converting one of the third through fifth hold signals selected by said second switching means, and outputting a third digital output corresponding to further lower c-bit data of the n-bit digital output signal, said first through third digital outputs being combined to provide said n-bit digital output signal;

wherein said third A/D conversion means includes:

(a) a second reference voltage generator, connected to said second A/D conversion means, for generating a second reference signal which changes in accordance with a content of the second digital output;

(b) a plurality of second voltage comparators, each of which includes a first switch for selectively supplying the second reference signal to one terminal of a first capacitor, a second switch for selectively supplying the analog input signal to said one terminal of said first capacitor, a first inverter, an input terminal of which is connected to the other terminal of said first capacitor (C10), a third switch for selectively connecting the input and output terminals of said first inverter, a fourth switch for selectively supplying the second reference signal to one terminal of a second capacitor, a fifth switch for selectively supplying the analog input signal to said one terminal of said second capacitor, a second inverter, an input terminal of which is connected to the other terminal of said second capacitor, a sixth switch for selectively connecting the input and output terminals of said second inverter, a seventh switch for selectively supplying the second reference signal to one terminal of a third capacitor, an eighth switch for selectively supplying the analog input signal to said one terminal of said third capacitor, a third inverter, an input terminal of which is connected to the other terminal of said third capacitor, and a ninth switch for selectively connecting the input and output terminals of said third inverter; and (c) an encoder for converting the comparison results from said plurality of second voltage comparators into the third digital output.

12. An A/D converter according to claim 11, wherein said third A/D conversion means includes:

(a) a second reference voltage generator, connected to said second A/D conversion means, for generating a second reference signal which changes in accordance with a content of the second digital output;

(b) a plurality of second voltage comparators, each of which includes a seventh switch for selectively supplying the second reference signal to one terminal of a third capacitor, an eighth switch for selectively supplying the analog input signal to said one terminal of said third capacitor, a third inverter, an input terminal of which is connected to the other terminal of said third capacitor, a ninth switch for selectively connecting the input and output terminals of said third inverter, a tenth switch for selectively supplying the second reference signal to one terminal of a fourth capacitor, an 11th switch for selectively supplying the analog input signal to said one terminal of said fourth capacitor, a fourth inverter, an input terminal of which is connected to the other terminal of said fourth capacitor, and a 12th switch for selectively connecting the input and output terminals of said fourth inverter, a 13th switch for selectively supplying the second reference signal to one terminal of a fifth capacitor, a 14th switch for selectively supplying the analog input signal to said one terminal of said fifth capacitor, a fifth inverter, an input terminal of which is connected to the other terminal of said fifth capacitor, and a 15th switch for selectively connecting the input and output terminals of said fifth inverter; and (c) a second encoder for converting the comparison results from said plurality of second voltage comparators into the third digital output.

13. An A/D converter for converting an analog input signal into a digital output signal having an n-bit binary code, wherein n, a, and b are positive integers, and n=a+b, and comprising:

first A/D conversion means for A/D-converting the analog input signal and outputting a first digital output corresponding to a-bit data in the n-bit digital output signal;

sample-hold means for sampling a signal level of the analog input signal, to generate a first hold signal, and sampling the signal level of the analog input signal, to generate a second hold signal, said sample-hold means outputting the second hold signal during a period in which the first hold signal is sampled, and outputting the first hold signal during a period in which the second hold signal is sampled;

second A/D conversion means for A/D-converting one of the first and second hold signals obtained by said sample-hold means, and outputting a second digital output corresponding to the remaining b-bit data of the n-bit digital output signal excluding the a bits, said first and second digital outputs being combined to provide said n-bit digital output signal; and delay means connected to said first A/D conversion means for delayng the first digital output until A/D conversion is completed by said second A/D conversion means, thereby synchronizing the first digital output from said first A/D conversion means to the second digital output from said second A/D conversion means.

14. An A/D converter according to claim 13, wherein the first A/D conversion means includes a first chopper comparator, and the second A/D conversion means includes a second and a third chopper comparator, and wherein each of said chopper comparators includes:

first switch means for selectively supplying a comparison reference signal to one terminal of a first capacitor;

second switch means for selectively supplying a signal to be compared to said one terminal of said first capacitor;

a second capacitor, one terminal of which is connected to the other terminal of said first capacitor;

an inverting amplifier, an input terminal of which is connected to the other terminal of said second capacitor;

third switch means for selectively connecting the input and output terminals of said inverting amplifier; and fourth switch means for selectively supplying a predetermined voltage to said other terminal of said first capacitor.

15. An A/D converter according to claim 13, wherein said second A/D conversion means includes:

first switch means for selectively supplying a comparison reference signal to one terminal of a first capacitor;

second switch means for selectively supplying a signal to be compared to said one terminal of said first capacitor;

a buffer amplifier, an input terminal of which is connected to the other terminal of said first capacitor, and which has a high input impedance and a low output impedance;

a second capacitor, one terminal of which is connected to an output terminal of said buffer amplifier;

an inverting amplifier, an input terminal of which is connected to the other terminal of said second capacitor;

third switch means for selectively connecting the input and output terminals of said inverting amplifier; and fourth switch means for selectively supplying a predetermined voltage to said other terminal of said first capacitor.

16. An A/D converter for converting an analog input signal into an n-bit binary code, and comprising:

first A/D conversion means for A/D-converting the input signal and determining upper bits of the n-bit binary code;

first and second sample-hold means which are alternately switched each time said first A/D conversion means samples the analog input signal, for sampling and holding the analog input signal in synchronism with a sampling timing of said first A/D conversion means;

second A/D conversion means comprising a reference voltage generator for generating a reference voltage of a predetermined value, based on a content of the binary code obtained by said first A/D conversion means, a voltage comparator for comparing the reference voltage and a voltage value of the analog input signal held in one of said first and second sample-hold means, which sample and hold the analog input signal corresponding to the binary code, and an encoder for encoding a comparison result output from said voltage comparator and determining lower bits of the n bits; and delay means connected to said first A/D conversion means for delaying the upper bits of the n-bit binary code until A/D conversion is completed by said second A/D conversion means, thereby synchronizing the upper bits of the n-bit binary code from said first A/D conversion means to the lower bits of the n-bit binary code from said second A/D conversion means.

17. An A/D converter according to claim 16, further comprising first and second chopper comparators which are used selectively, said first and second chopper comparators respectively constituting said first and second sample-hold means, and said voltage comparator, and wherein each of said chopper comparators includes:
    first switch means for selectively supplying a comparison reference signal to one terminal of a first capacitor;
    second switch means for selectively supplying a signal to be compared to said one terminal of said first capacitor;
    a second capacitor, one terminal of which is connected to the other terminal of said first capacitor;
    an inverting amplifier, an input terminal of which is connected to the other terminal of said second capacitor;
    third switch means for selectively connecting the input and output terminals of said inverting amplifier; and
    fourth switch means for selectively supplying a predetermined voltage to said other terminal of said first capacitor.

18. An A/D converter for converting an analog input signal into a digital output signal having an n-bit binary code, wherein n, a, and b are positive integers, and n=a+b, and comprsing:
    first A/D conversion means for A/D-converting the analog input signal into a first digital output corresponding to upper a-bit data of the n-bit digital output signal;
    first sample-hold means for sampling a signal level of the analog input signal and outputting a first hold signal;
    second sample-hold means for sampling a signal level of the analog input signal and outputting a second hold signal;
    first switching means for, in synchronism with the A/D conversion operation of said first A/D conversion means, selecting the second hold signal from said second sample-hold means during a period in which said first sample-hold means samples the signal level of the analog input signal, and selecting the first hold signal from said first sample-hold means during a period in which said second sample-hold means samples the signal level of the analog input signal; and
    second A/D conversion means for A/D-converting one of the first and second hold signals selected by said first switching means, and outputting a second digital output corresponding to lower b-bit data of the n-bit digital output signal, said first and second digital outputs being combined to provide said n-bit digital output signal.

19. An A/D converter for converting an analog input signal into a digital output signal having an n-bit binary code, wherein n, a, and b are positive integers, and n=a+b, and comprising:
    first A/D conversion means for A/D-converting the analog input signal and outputting a first digital output corresponding to a-bit data in the n-bit digital output signal;
    sample-hold means for sampling a signal level of the analog input signal, to generate a first hold signal, and sampling the signal level of the analog input signal, to generate a second hold signal, said sample-hold means outputting the second hold signal during a period in which the first hold signal is sampled, and outputting the first hold signal during a period in which the second hold signal is sampled; and
    second A/D conversion means for A/D-converting one of the first and second hold signals obtained by said sample-hold means, and outputting a second digital output corresponding to the remaining b-bit data of the n-bit digital output signal excluding the a bits, said first and second digital outputs being combined to provide said n-bit digital output signal.

20. An A/D converter for converting an analog input signal into an n-bit binary code, and comprising:
    first A/D conversion means for A/D-converting the input signal and determining upper bits of the n-bit binary code;
    first and second sample-hold means which are alternately switched each time said first A/D conversion means samples the analog input signal, for sampling and holding the analog input signal in synchronism with a sampling timing of said first A/D conversion means;
    second A/D conversion means comprising a reference voltage generator for generating a reference voltage of a predetermined value, based on a content of the binary code obtained by said first A/D conversion means, a voltage comparator for comparing the reference voltage and a voltage value of the analog input signal held in one of said first and second sample-hold means, which sample and hold the analog input signal corresponding to the binary code, and an encoder for encoding a comparison result output from said voltage comparator and determining lower bits of the n bits.

* * * * *